(12) United States Patent
Ma et al.

(10) Patent No.: US 7,933,747 B2
(45) Date of Patent: Apr. 26, 2011

(54) METHOD AND SYSTEM FOR SIMULATING DYNAMIC BEHAVIOR OF A TRANSISTOR

(75) Inventors: Yutao Ma, San Jose, CA (US);
Min-Chie Jeng, Cupertino, CA (US);
Bruce W. McGaughy, Fremont, CA (US); Lifeng Wu, Fremont, CA (US);
Zhihong Liu, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 506 days.

(21) Appl. No.: 11/935,969

(22) Filed: Nov. 6, 2007

(65) Prior Publication Data
US 2009/0119085 A1    May 7, 2009

(51) Int. Cl.
*G06F 17/10*    (2006.01)

(52) U.S. Cl. .................. 703/2; 703/13; 703/14; 703/15; 703/16; 703/17; 703/19; 716/100; 716/101; 716/132; 716/134; 716/136

(58) Field of Classification Search .......... 703/2, 13–17, 703/19; 716/1, 4, 6, 100, 101, 132, 134, 716/136
See application file for complete search history.

(56) References Cited

U.S. PATENT DOCUMENTS

| | | | | | |
|---|---|---|---|---|---|
| 5,467,291 | A | * | 11/1995 | Fan et al. .......................... | 703/14 |
| 5,652,716 | A | * | 7/1997 | Battersby ......................... | 703/13 |
| 5,790,436 | A | * | 8/1998 | Chen et al. ....................... | 716/5 |
| 6,472,233 | B1 | * | 10/2002 | Ahmed et al. ................... | 438/14 |
| 6,580,431 | B1 | * | 6/2003 | Deosaran et al. .............. | 345/503 |
| 6,618,837 | B1 | * | 9/2003 | Zhang et al. ....................... | 716/4 |
| 6,760,692 | B1 | * | 7/2004 | Rose .................................. | 703/2 |
| 7,343,571 | B2 | * | 3/2008 | Miura et al. ....................... | 716/4 |
| 7,735,034 | B2 | * | 6/2010 | Miura et al. ....................... | 716/4 |
| 2005/0086033 | A1 | * | 4/2005 | Chen et al. ....................... | 703/2 |
| 2005/0120315 | A1 | * | 6/2005 | Miura et al. ....................... | 716/4 |
| 2008/0244477 | A1 | * | 10/2008 | Miura et al. ....................... | 716/4 |

OTHER PUBLICATIONS

Cheng et al. Mosfet Modeling and BSIM3 User's Guide. [online] 2002 [retrieved on Nov. 30, 2009] [pp. 1-2, 243-243-244, 285-297, and 384-385] Springerlink Database.*
Cheng et al, "MOSFET Modeling & BSIM3 User'S Guide", 2002, pp. 1-2, 243-244,285-297, and 384-385.*
Liu et al., "BSIM 3v3.2.2 MOSFET Model, Users' Manual", 1999, pp. 1-210.*

(Continued)

*Primary Examiner* — Kamini S. Shah
*Assistant Examiner* — Kibrom Gebresilassie
(74) *Attorney, Agent, or Firm* — Thomas Chan

(57) ABSTRACT

Method and system are disclosed for modeling dynamic behavior of a transistor. The method includes representing static behavior of a transistor using a lookup table, selecting an instance of the transistor from the lookup table for modeling dynamic behavior of the transistor, computing a previous state of the instance using a non-quasi static analytical model, computing a variation in channel charge of the instance according to a rate of change in time, computing a current state of the instance using the previous state and the variation in channel charge, computing a modified terminal voltage that includes a dynamic voltage across a parasitic resistance at the terminal of the transistor according to the current state and previous state of the instance, and storing the modified terminal voltage in a memory device for modeling dynamic behavior of the transistor at the current state.

20 Claims, 5 Drawing Sheets

OTHER PUBLICATIONS

Porret, A. et al., "A Compact Non-Quasi-Static Extension of a Charge-Based MOS Model", IEEE Transaction on Electron Devices, vol. 48, No. 8, Aug. 2001, pp. 1647-1654.

Hu, C. "MOS Device Research", Final Report 1999-2000 for MICRO Project, Department of Electrical Engineering and Computer Sciences, University of California, Berkeley, CA.

* cited by examiner

METHOD AND SYSTEM FOR SIMULATING DYNAMIC BEHAVIOR OF A TRANSISTOR

FIELD OF THE INVENTION

The present invention relates to the field of electronic design automation tools. In particular, the present invention relates to a method and system for modeling dynamic behavior of a transistor.

BACKGROUND OF THE INVENTION

The development of complicated integrated circuits often requires powerful numerical simulation programs. For example, circuit simulation is an essential part in the design flow of integrated circuits, helping circuit designers to verify the functionality and performance of their designs without going through expensive fabrication processes. Examples of electronic circuit simulators include the Simulation Program with Integrated Circuit Emphasis (SPICE) developed at the University of California, Berkeley (UC Berkeley), and various enhanced versions or derivatives of SPICE, such as SPECTRE, developed by Cadence Design Systems, Inc. SPICE and its derivatives or enhanced versions will be referred to hereafter as SPICE circuit simulators, or SPICE.

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc. SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal I; $V_j$ ($j=1, \ldots, n$) represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i=1, \ldots, n.$$

where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

A complex integrated circuit may contain millions of circuit elements such as transistors, resistors, and capacitors. Integrated circuit design relies on circuit simulation to verify functionality and electrical behavior of the circuit. As the integrated circuit becomes more complex, faster simulation tools are required to simulate the whole circuit in an acceptable time frame. One of the techniques in fast simulation is by means of a table-lookup approach. The table-lookup approach uses a pre-built lookup table to store device behavior in terms of terminal currents and node charges as function of terminal biases for model evaluation. An example of a pre-built lookup table may be a three-dimensional table containing device behavior at incremental voltages between the drain and source ($V_{ds}$), gate and source ($V_{gs}$), and body and source ($V_{bs}$) of a MOSFET transistor. These conventional approaches use interpolation to calculate terminal current and node charges of the devices for arbitrary biases during simulation.

Conventional table-lookup approaches may be considered as one kind of modeling of a device's quasi static (QS) behavior, where node charges and terminal currents are determined by the terminal voltage at a particular point in time only. Such conventional approaches fail to accurately model high speed submicron devices where the device's non-quasi static (NQS) behavior, such as the history of the terminal voltages, also plays a significant role in determining the behavior of the circuit. The conventional table-lookup approaches are inadequate in this regard for a number of reasons. First, if the conventional lookup table is modified to include the time dimension, it would increase the conventional three-dimensional table to a four-dimensional table, which in turn increases the amount of dynamic random access memory required by an order of magnitude in order to run circuit simulation. This approach is not only expensive but also infeasible for simulation of large designs. In addition, increasing the dimensions of the conventional lookup table also increases the evaluation time by an order of magnitude, which adversely impacts the performance of the fast SPICE simulation.

Another limitation of the conventional table-lookup approach is that it is ineffective when applied to handle a gate resistance network. For RF and high speed integrated circuit applications, especially in submicron technologies of 65 nm and below, the gate resistance is no longer negligible. The effect of the gate resistance on a device's behavior is primarily a dynamic behavior. When a gate terminal of a MOSFET transistor is charging or discharging, the gate current flows through the gate resistance, which affects the gate voltage applied to the transistor by a dynamic voltage across the gate resistance. This scenario is not addressed by the conventional table-lookup approaches because the conventional lookup tables were built statically. For this reason, the conventional lookup tables do not model the dynamic charging/discharging voltage offset caused by the gate resistance. A possible attempt to address this issue is to add a resistance at gate node outside the lookup table. But this solution creates additional issues in circuit partition and may cause convergence problems for fast SPICE simulators.

Similarly, the conventional table-lookup approach is ineffective when applies to handle substrate resistance and source-drain parasitic resistance networks. This is because the conventional lookup tables were built statically based on the external drain/source/gate/substrate voltages. This means that the conventional lookup tables only include the voltage across the parasitic resistances by static DC current. Thus, the conventional lookup tables may only account for the static voltage offset caused by those resistances, but the dynamic voltage offset, which could be much bigger than the static voltage offset during high speed transient processes, is ignored in the conventional table-lookup approach. For source/drain resistance, this may be acceptable when parasitic source/drain resistances are small. However, ignoring the dynamic voltage in the gate resistance may lead to inaccurate modeling and simulation of the devices.

Therefore, there is a need for a method and system that address the issues of the conventional table-lookup approach described above. Specifically, there is a need for a method and system for modeling integrated circuits for fast simulation.

SUMMARY

Method and system are disclosed for modeling dynamic behavior of a transistor. In one embodiment, a method for modeling dynamic behavior of a transistor includes representing static behavior of a transistor using a lookup table, selecting an instance of the transistor from the lookup table for modeling dynamic behavior of the transistor, computing a previous state of the instance using a non-quasi static analytical model, computing a variation in channel charge of the instance according to a rate of change in time, computing a current state of the instance using the previous state and the variation in channel charge, computing a modified terminal voltage that includes a dynamic voltage across a parasitic resistance at the terminal of the transistor according to the current state and previous state of the instance, and storing the modified terminal voltage in a memory device for modeling dynamic behavior of the transistor at the current state.

In another embodiment, a system for modeling dynamic behavior of a transistor includes at least one processing unit for executing computer programs, a graphical-user-interface for viewing representations of the integrated circuit on a display, and a memory for storing information of the integrated circuit. The system further includes logic for representing static behavior of a transistor using a lookup table, logic for selecting an instance of the transistor from the lookup table for modeling dynamic behavior of the transistor, logic for computing a previous state of the instance using a non-quasi static analytical model, logic for computing a variation in channel charge of the instance according to a rate of change in time, logic for computing a current state of the instance using the previous state and the variation in channel charge, logic for computing a modified terminal voltage that includes a dynamic voltage across a parasitic resistance at the terminal of the transistor according to the current state and previous state of the instance, and logic for storing the modified terminal voltage in a memory device for modeling dynamic behavior of the transistor at the current state.

In yet another embodiment, a computer program product for modeling dynamic behavior of a transistor includes a medium storing computer programs for execution by one or more computer systems. The computer program product also includes code for representing static behavior of a transistor using a lookup table that describes a plurality of instances of the transistor according to a plurality of predefined parameters, code for selecting an instance of the transistor from the lookup table for modeling dynamic behavior of the transistor, code for computing a previous state of the instance using a non-quasi static analytical model, code for computing a variation in channel charge of the instance according to a rate of change in time, code for computing a current state of the instance using the previous state and the variation in channel charge, code for computing a modified terminal voltage at a terminal according to the current state and previous state of the instance, wherein the modified terminal voltage comprises a dynamic voltage across a parasitic resistance at the terminal of the transistor, and code for storing the modified terminal voltage in a memory device for modeling dynamic behavior of the transistor at the current state.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

DESCRIPTION OF EMBODIMENTS

Methods and systems are provided for modeling dynamic behavior of a transistor. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

There are two general categories of device models for circuit simulation, namely the QS (Quasi Static) model and the NQS (Non-Quasi Static) model. The QS model assumes that the terminal currents and node charges of the device are solely dependent on terminal biases at the current time point, and there is no dependency on the terminal biases at the prior time point, or the prior history (states) of the device. This assumption is an approximation for simplification. In reality, both the terminal currents and node charges depend on the current terminal biases, as well as on the history of the terminal biases and/or the history of the device states. Device models that include the dependency of the history of device behavior are called NQS models. In general, the QS model may give good approximation of real device behavior at lower speed and lower frequency operations. The NQS model, however, is required for simulating high speed and high frequency operations of the integrated circuit.

Figure 1:
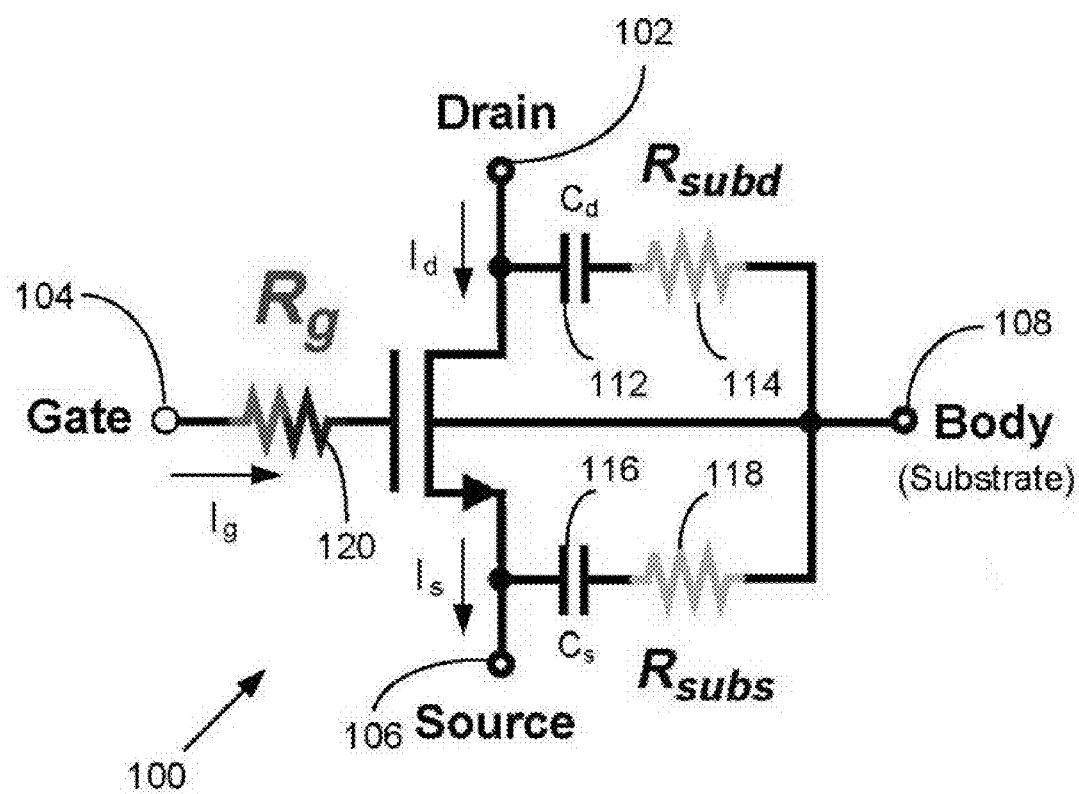
FIG. 1 illustrates a model of MOSFET device according to embodiments of the present invention.

FIG. 1 illustrates a model of MOSFET device according to embodiments of the present invention. As shown in FIG. 1, MOSFET device 100 includes a drain terminal 102, a gate terminal 104, a source terminal 106, and a body (also referred to as the substrate) terminal 108. The currents that flow through the drain, gate, source terminals are represented by $I_d$, $I_g$, and $I_s$ respectively. There are parasitic capacitor $C_d$ 112 and parasitic resistor $R_{subd}$ 114 between the drain terminal 102 and the body terminal 108. Similarly, there are parasitic capacitor $C_s$ 116 and parasitic resistor $R_{subs}$ 118 between the source terminal 106 and the body terminal 108. The parasitic resistor at the gate terminal is represented by resistor $R_g$ 120. Persons skilled in the art would understand that other types of transistors may be modeled in a similar manner.

According to embodiments of the present invention, the dynamic voltage across the parasitic resistances at the source, drain, and gate terminals in MOSFET devices may be modeled in two parts. The first part is a static DC (direct current) component when device terminal voltages are constant; and the second part is a dynamic component caused by charging and discharging of electronic charges in the channel when terminal voltages are changing. In RF (radio frequency) or high speed integrated circuit applications, the parasitic resistances in the substrate and gate electrodes are necessary for accurately modeling the device behavior. A current flow through a substrate resistance can include both a static DC current and a dynamic charge current. Usually, the static DC current is relatively small compared to the dynamic charge current. For example, a current through the gate resistor is dominated by the dynamic current from the gate capacitance charging and discharging in most cases. One source of the static DC current through the gate resistance is the leakage current through gate oxide when the oxide is very thin in modern submicron processing technologies.

Figure 2:
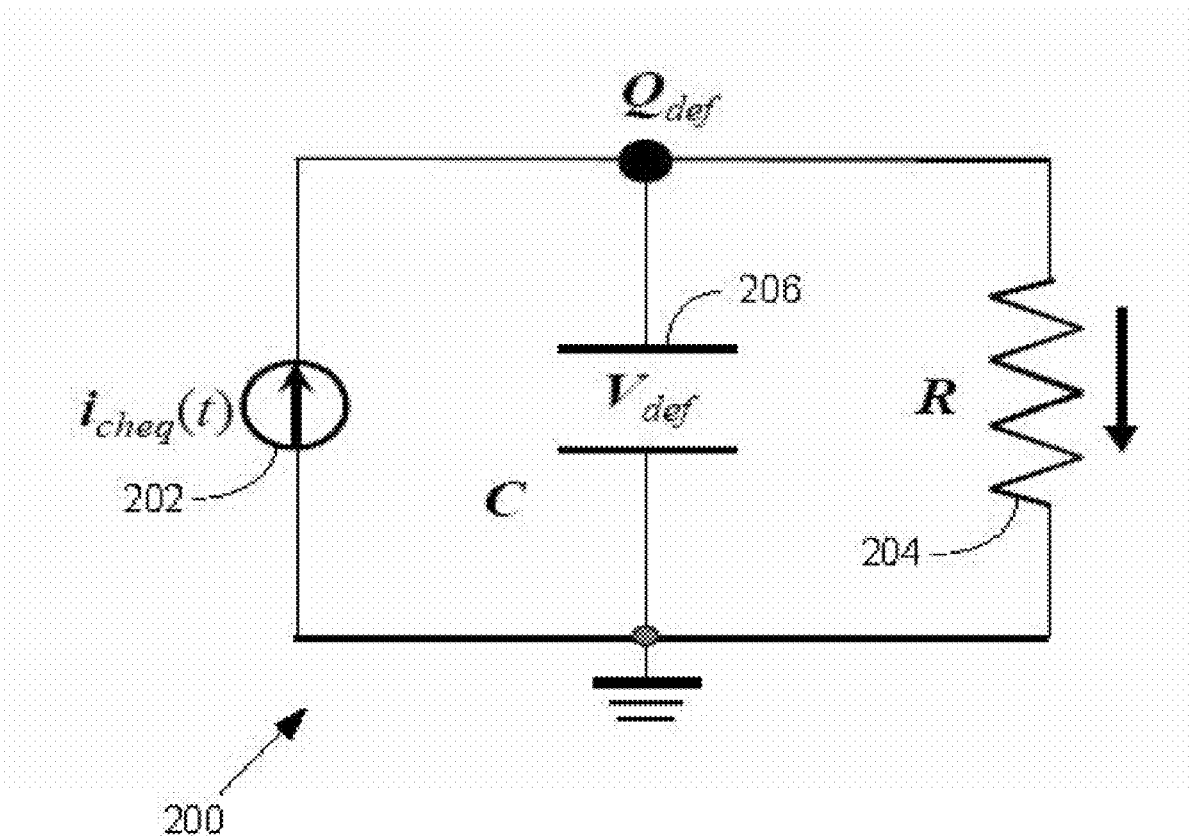
FIG. 2 illustrates an example of an RC network for modeling the channel charge of a MOSFET device during transient simulation according to embodiments of the present invention.

In one approach, an analytical NQS model may use a RC network to model the deficit/surplus charge in the channel of a circuit device during transient simulation. FIG. 2 illustrates an example of an RC network for modeling channel charge of a MOSFET device during transient simulation according to embodiments of the present invention. The RC network 200 includes a current source $i_{cheq}(t)$ 202, a resistor R 204, and a capacitor C 206. The voltage across the capacitor C is represented by $V_{def}$ and the deficit/surplus charge stored by the RC network is represented by the symbol $Q_{def}$. The deficit/surplus charge is defined as the difference between actual channel charge and the charge at equilibrium under a given bias. Equation 1 below provides a mathematical representation of $Q_{def}$, where the deficit/surplus charge in the channel at time t is the difference between the charge in the channel at equilibrium and the charge in the channel at time t. Equation 2 provides a mathematical representation of the charge of deficit/surplus charge in the channel with respect to time, which is the difference in charge in the channel at equilibrium with respect to time and the DC component of the current due to the deficit/surplus charge.

$$Q_{def}(t) = Q_{cheq}(t) - Q_{ch}(t) \tag{1}$$

$$\frac{\partial Q_{def}(t)}{\partial t} = \frac{\partial Q_{cheq}(t)}{\partial t} - \frac{Q_{def}(t)}{\tau} \tag{2}$$

After the deficit/surplus charge is determined, it is then used to calculate dynamic terminal current $i_D$, $i_G$, $i_s$ at a particular point in time (t) due to channel charge variations according to equation 3 and equation 4 as shown below.

$$i_{D,G,S}(t) = I_{D,G,S}(DC) + \frac{\partial Q_{d,g,s}(t)}{\partial t} \tag{3}$$

$$\frac{\partial Q_{g,g,s}(t)}{\partial t} = D, G, S_{xpart} \frac{Q_{def}(t)}{\tau} \tag{4}$$

Note that using the RC network for retaining the state of the MOSFET device may lead to an increase of memory usage in modeling NQS effects. This is because the independent RC network used in the NQS analytical model requires an additional dimension of freedom in the device model. In other words, using this approach would increase the dimension of the lookup table from three dimensions to four dimensions, which would increase the consumption of dynamic random access memory by one order of magnitude during simulation. In addition, this increase in dimension of the device model also increases the amount of time required for device model evaluation. Also note that an analytical NQS model may use a resistor-inductor-capacitor (RLCK) network to model the deficit/surplus charge in the channel of a circuit device during transient simulation, where the L and K are the self and mutual inductances of the RLCK network, which may be represented generally by a set of linear differential equations for modeling the behavior of the transistor.

Another method for modeling the NQS effect in a MOSFET device is the table lookup approach according to embodiments of the present invention. In this method, a MOSFET device is modeled with four parameters, namely Id, $Q_g$, $Q_d$ and $Q_b$ respectively. The raw data of each of the parameters are stored separately in memory, also referred to as a table. Each table describes dependency information of each parameter in three dimensions with respect to $V_{ds}$, $V_{gs}$, and $V_{bs}$ of the device.

Figure 3:
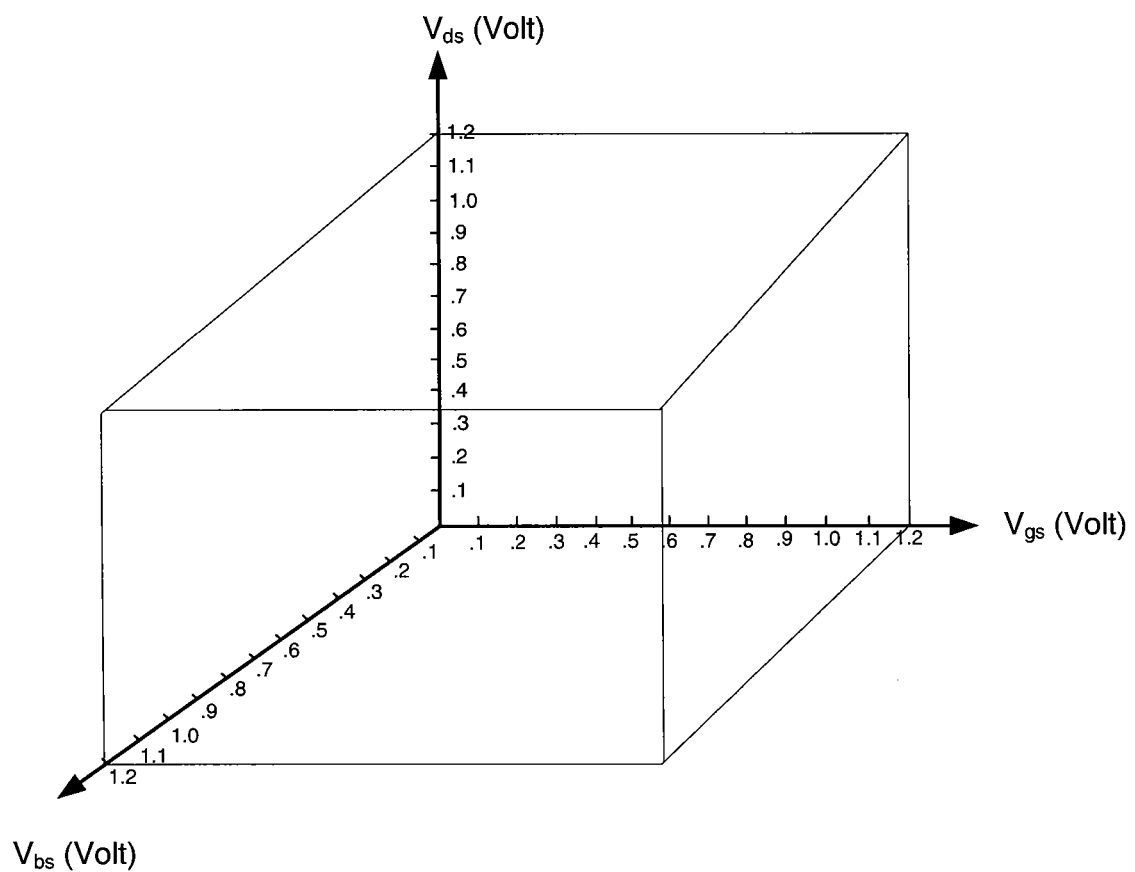
FIG. 3 illustrates information stored in a table using a three-dimensional graph according to embodiments of the present invention.

FIG. 3 illustrates information stored in a table using a three-dimensional graph according to embodiments of the present invention. As shown in this example, the table is represented in a three dimensional graph with axes $V_{ds}$, $V_{gs}$, and $V_{bs}$. $V_{ds}$, $V_{gs}$, and $V_{bs}$ represent the voltage between the drain terminal and the source terminal, the gate terminal and the source terminal, and the body terminal and the source terminal respectively. An instance in the lookup table may be identified with its corresponding $V_{ds}$, $V_{gs}$, and $V_{bs}$ values, for example $P_1$ ($V'_{gs}$, $V'_{ds}$, $V'_{bs}$). In this graph, each axis is represented by a predefined incremental step that may be selected by a designer for tracking changes of the parameter with respect to $V_{ds}$, $V_{gs}$, and $V_{bs}$ in the lookup table. For example, incremental steps of 0.1, 0.05v, 0.01 v, or other values may be used to satisfy different design objectives.

The lookup table may be built to cover more than the normal $V_{dd}$ range, usually 1.5 times of the $V_{dd}$ range, to ensure good convergence for circuit simulation. The continuity of the table evaluation results may be maintained by interpolation of a particular point in the graph by its neighbors using second or higher order polynomial. This means that for each data point, four independent variables are stored, including the raw data and the derivatives of the quantities with respect to each terminal bias. In one example, for a single lookup table used in a circuit with $V_{dd}$ between 0 and 1.5 volt, memory consumption is about 5.8 M bytes. In other implementations, different techniques may be used to optimize memory consumption of the table, so that the real memory consumption of one single table may be a few hundred Kbytes. If the lookup table is increased from three dimensions to four dimensions, the memory for storing the table may be increased by a few hundred times depending on the accuracy requirement of the lookup table. So, to simulate a complex integrated circuit using the table-lookup approach, many gigabytes of dynamic random access memory would be required, which would be challenging for many conventional computer systems. If the lookup table is increased from three dimensions to four dimensions, table evaluation time may be increased by orders of magnitude.

Figure 4:
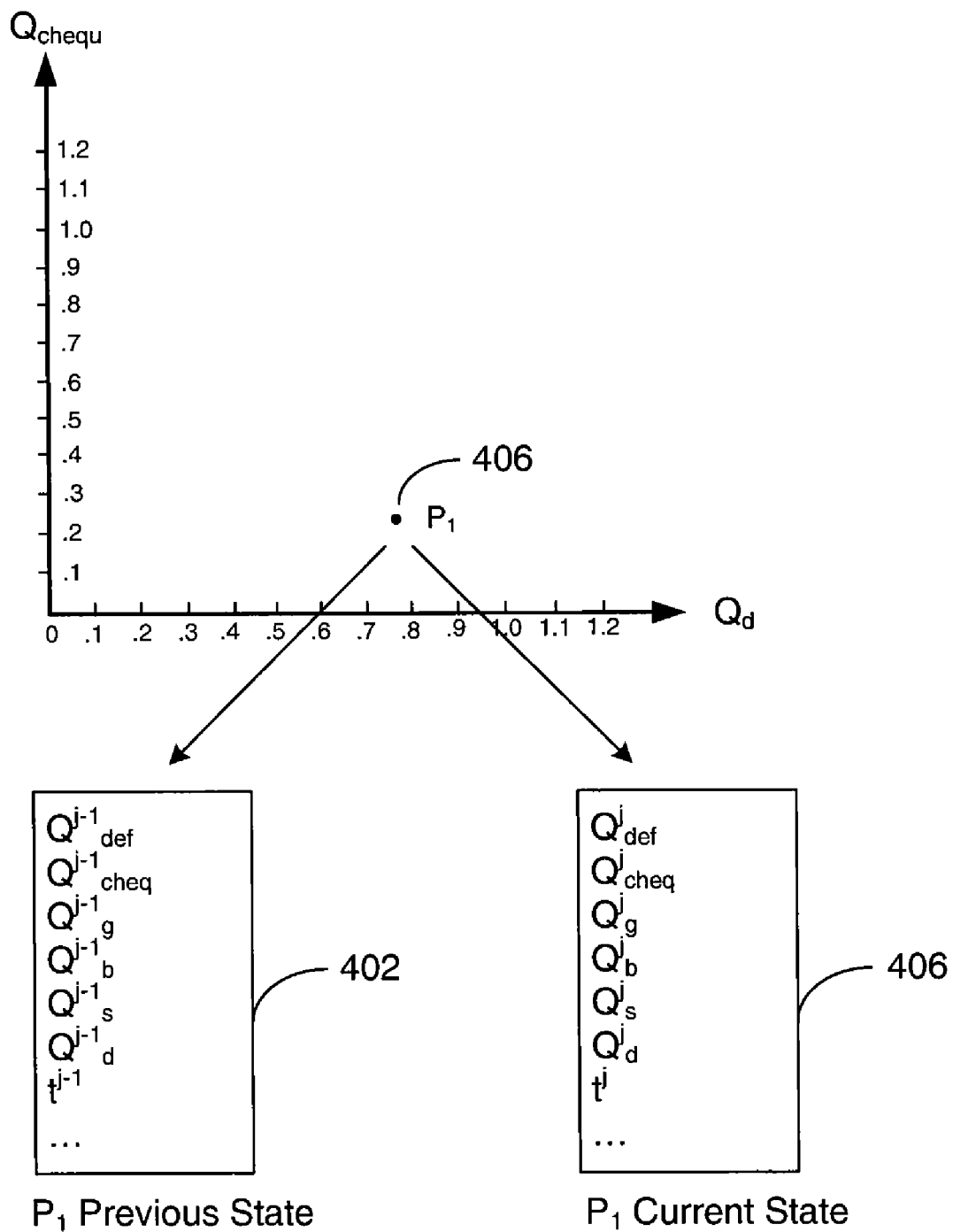
FIG. 4 illustrates a method for modeling NQS effects of a device using a dynamic state retention approach according to embodiments of the present invention.

FIG. 4 illustrates a method for modeling NQS effects of a device using a dynamic state retention approach according to embodiments of the present invention. This method integrates a dynamic state retention approach to the table lookup approach for modeling NQS effects in a MOSFET device. In this example, the previous state and current state of an instance of the device (represented by point $P_1$) 406 may be stored for modeling the NQS effects of the MOSFET device. The values $Q^{j-1}_{def}$, $Q^{j-1}_{cheq}$, $Q^{j-1}_g$, $Q^{j-1}_b$, $Q^{j-1}_s$, $Q^{j-1}d$ and, $t^{j-1}$ of the previous state 402 of an instance at the last converged time point $t^{j-1}$ are stored and used for computing the values $Q^j_{def}$, $Q^j_{cheq}$, $Q^j_g$, $Q^j_b$, $Q^j_s$, $Q^j_d$, and, $t^j$ of the current state 404 during model evaluation. For example, equation (6) is used to calculate deficit/surplus charge at the current time point, and equation (3) is used to calculate the additional current component due to deficit/surplus channel charge. With this approach, instead of building lookup tables for storing $Q_g$, $Q_d$ and $Q_b$, the method builds a lookup table for storing $Q_{cheq}$ and $Q_d$.

Note that the values $Q^{j-1}_{def}$, $Q^{j-1}_{cheq}$, $Q^{j-1}_g$, $Q^{j-1}_b$, $Q^{j-1}_s$, $Q^{j-1}_d$ and, $t^{j-1}$ represent the deficit/surplus charge, the channel equilibrium charge, the charges at the gate/body/source/drain terminals, and the simulation time at the last converged time point. Similarly, the values $Q^j_{def}$, $Q^j_{cheq}$, $Q^j_g$, $Q^j_b$, $Q^j_s$, $Q^j_d$, and, $t^j$ represent the deficit/surplus charge, the channel equi- librium charge, the charges at the gate/body/source/drain terminals, and the simulation time at the current time point to be evaluated. In other embodiments, a subset of the parameters shown in FIG. 4 or other parameters of the device may be used to represent the state of a device. In yet other embodiments, multiple previous states may be stored and used for computing the current state of the device.

With the dynamic state retention approach, instead of using an RC network to calculate $Q_{def}$ it solves $Q_{def}$ directly. From equation (2), the change in deficit/surplus charge in the channel with respect to time may be expressed as:

$$\frac{Q^j_{def} - Q^{j-1}_{def}}{t_j - t_{j-1}} = \frac{Q^j_{cheq} - Q^{j-1}_{cheq}}{t_j - t_{j-1}} - \frac{Q^j_{def} + Q^{j-1}_{def}}{2*\tau} \quad (5)$$

After the values of $Q_{def}$ and $Q_{cheq}$ at the last time point are stored, the $Q_{def}$ at the current time point may be calculated by the following equation.

$$Q^j_{def} = \frac{Q^j_{cheq} - Q^{j-1}_{cheq} + Q^{j-1}_{def} * \left(1 - \frac{t_j - t_{j-1}}{2*\tau}\right)}{1 + \frac{t_j - t_{j-1}}{2*\tau}} \quad (6)$$

Note that memory consumption of the dynamic state retention approach for NQS modeling uses less memory than the original table-lookup approach without dynamic state retention capabilities. This is because the dynamic state retention approach does not need to build tables for storing $Q_g$, $Q_d$ and $Q_b$, and instead it builds tables for $Q_{cheq}$ and $Q_d$. When the model uses a fixed partition, for example a 50/50 partition, the table for storing $Q_d$ is not needed either.

In addition, model evaluation for the dynamic state retention approach for NQS models is less than the convention table-lookup approach for QS models. This is because the conventional table-lookup approach for QS models is required to evaluate for $I_d$, $Q_g$, $Q_d$, and $Q_s$, while the dynamic state retention with table-lookup approach for modeling NQS is required to evaluate for $I_d$, $Q_{def}$, and $Q_d$. Thus, the dynamic state retention approach has one less parameter to evaluate.

The dynamic state retention approach accounts for the dynamic voltage across the gate/substrate/source/drain resistance by calculating the dynamic part of the currents flowing through those parasitic resistances. The dynamic part of the currents can be calculated as follows, which are derived from equation 3 and equation 4:

$$v_g = i_g \cdot R_g = G_{xpart} \cdot \frac{Q^j_{def}}{\tau} \cdot R_g \quad (7A)$$

$$v_b = i_b \cdot R_b = B_{xpart} \cdot \frac{Q^j_{def}}{\tau} \cdot R_b \quad (8A)$$

$$v_s = i_s \cdot R_s = S_{xpart} \cdot \frac{Q^j_{def}}{\tau} \cdot R_s \quad (9A)$$

$$v_d = i_d \cdot R_d = D_{xpart} \cdot \frac{Q^j_{def}}{\tau} \cdot R_d \quad (10A)$$

The dynamic voltage across the parasitic resistance at the gate terminal ($v_g$) equals to the dynamic current component ($i_g$) times the parasitic resistance ($R_g$), where the dynamic current component ($i_g$) is derived from $Q_{def}$ using charge partition $G_{xpart}$. The dynamic voltages $v_b$, $v_s$, and $v_d$ across the parasitic resistances at the substrate $R_b$, source $R_s$, and drain $R_b$ are computed respectively in a similar manner.

Yet there is another approach to calculate the dynamic part of the terminal current, if one only concerns the parasitic resister effect by dynamic current. The dynamic state retention approach accounts for the dynamic voltage across the gate/substrate/source/drain resistance by calculating the dynamic part of the currents flowing through those parasitic resistances. According to embodiments of the present invention, the gate/substrate/source/drain terminal charges at previous time point are stored in states of the device as $Q_g^{j-1}$, $Q_b^{j-1}$, $Q_s^{j-1}$, $Q_d^{j-1}$, and the gate/substrate/source/drain terminal charges at the current time points are calculated by using the static table-lookup approach as $Q_g^j$, $Q_b^j$, $Q_s^j$, $Q_d^j$. The dynamic current flowing through the parasitic resistances and the dynamic part of the voltage across those resistances is then calculated respectively by the following equations.

$$v_g = i_g \cdot R_g = \frac{Q_g^j - Q_g^{j-1}}{t_j - t_{j-1}} \cdot R_g \quad (7B)$$

$$v_b = i_b \cdot R_b = \frac{Q_b^j - Q_b^{j-1}}{t_j - t_{j-1}} \cdot R_b \quad (8B)$$

$$v_s = i_s \cdot R_s = \frac{Q_s^j - Q_s^{j-1}}{t_j - t_{j-1}} \cdot R_s \quad (9B)$$

$$v_d = i_d \cdot R_d = \frac{Q_d^j - Q_d^{j-1}}{t_j - t_{j-1}} \cdot R_d \quad (10B)$$

The dynamic voltage across the parasitic resistance at the gate terminal ($v_g$) equals to the dynamic current component ($i_g$) times the parasitic resistance ($R_g$), where the dynamic current component ($i_g$) is the ratio of the change in charge at the gate terminal ($Q_g^j - Q_g^{j-1}$) with respect to change in time ($t^j - t^{j-1}$). The dynamic voltages $v_b$, $v_s$, and $v_d$ across the parasitic resistances at the substrate $R_b$, source $R_s$, and drain $R_b$ are computed respectively in a similar manner.

Therefore, for current evaluation using the static table-lookup approach, the actual voltage used ($V_g^{used}$) as input to the lookup table for voltage at the gate is computed by equation (11), which is the difference between the external voltages ($V_g^{input}$) and the dynamic voltage across the parasitic resistance at the gate terminal. Similarly, the actual voltage used as input to the lookup table for voltages at the substrate/source/drain is computed by equations (12)-(14) respectively.

$$V_g^{used} = V_g^{input} - v_g \quad (11)$$

$$V_b^{used} = V_b^{input} - v_b \quad (12)$$

$$V_s^{used} = V_s^{input} - v_s \quad (13)$$

$$V_d^{used} = V_d^{input} - v_d \quad (14)$$

In this manner, the terminal voltages used to calculate the static terminal currents in the static table-lookup approach includes the effect of the dynamic voltage across the parasitic resistances. As a result, the dynamic state retention approach provides a model that accounts for the dynamic voltage across the parasitic resistances and at the same time reducing the memory usage and increasing performance of model evaluation for modeling the NQS effect of a MOSFET device.

Figure 5:
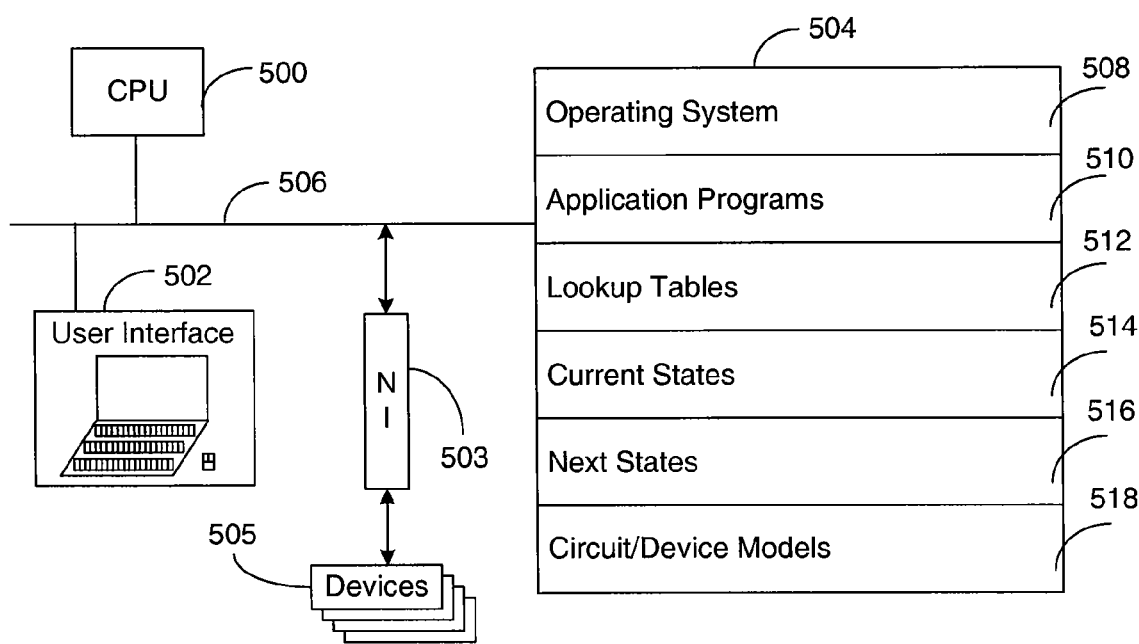
FIG. 5 illustrates a system for modeling a device of an integrated circuit according to an embodiment of the present invention.

FIG. 5 illustrates a system for modeling a device of an integrated circuit according to an embodiment of the present invention. In one embodiment, the method and system for modeling a device of an integrated circuit may be implemented using a computer system. The computer system may include one or more central processing units (CPUs) 500, at least one user interface 502 for displaying computation results and waveforms, a memory device 504, a system bus 506, and one or more bus interfaces for connecting the CPU, user interface, memory device, and system bus together. The computer system also includes at least one network interface 503 for communicating with other devices 505 on a computer network. In alternative embodiments, much of the functionality of the method and system for conducting low-power design explorations may be implemented in one or more application-specific integrated circuits (ASICs) or field-programmable gate arrays (FPGAs), thereby either eliminating the need for a CPU, or reducing the role of the CPU.

The memory device 504 may include high-speed random-access memory and may also include non-volatile memory, such as one or more magnetic disk storage devices. The memory device may also include mass storage that is located remotely from the CPU(s). The memory device preferably stores:

- an operating system 508 that includes procedures for handling various basic system services and for performing hardware-dependent tasks;
- application programs 510 for performing other user-defined applications and tasks, such as circuit simulations and device/table evaluations;
- databases for storing information of the integrated circuit, the databases include lookup tables 512, previous states 514, current states 516, and circuit/device models 518.

The databases, the application programs, and the program for modeling a device may include executable procedures, sub-modules, tables, and other data structures. In other embodiments, additional or different modules and data structures may be used, and some of the modules and/or data structures listed above may not be used.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A computer-implemented method for simulating dynamic behavior of a transistor, comprising:
   representing static behavior of a transistor using a lookup table, wherein the lookup table describes a plurality of instances of the transistor according to a plurality of predefined parameters, including
   a channel equilibrium charge of the transistor with respect to variations of voltages between a drain terminal and a source terminal, between a gate terminal and the source terminal, and between a body terminal and the source terminal, and
   a charge of the transistor at the drain terminal with respect to variations of voltages between the drain terminal and the source terminal, between the gate terminal and the source terminal, and between the body terminal and the source terminal;
   selecting an instance of the transistor from the lookup table for computing dynamic behavior of the transistor;
   computing a previous state of the instance using a non-quasi static analytical model;
   computing a variation in channel charge of the instance according to a rate of change in time;
   computing a current state of the instance using the previous state and the variation in channel charge;
   computing a modified terminal voltage at a terminal according to the current state and previous state of the instance with respect to change in time, wherein the modified terminal voltage comprises a dynamic voltage across a parasitic resistance at the terminal of the transistor; and
   storing the modified terminal voltage in a memory device for computing dynamic behavior of the transistor at the current state.

2. A computer-implemented method for simulating dynamic behavior of a transistor, comprising:
   representing static behavior of a transistor using a lookup table, wherein the lookup table describes a plurality of instances of the transistor according to a plurality of predefined parameters;
   selecting an instance of the transistor from the lookup table for computing dynamic behavior of the transistor;
   computing a previous state of the instance using a non-quasi static analytical model;
   computing a variation in channel charge of the instance according to a rate of change in time;
   computing a current state of the instance using the previous state and the variation in channel charge;
   computing a modified terminal voltage at a terminal according to the current state and previous state of the instance with respect to change in time, wherein the modified terminal voltage comprises a dynamic voltage across a parasitic resistance at the terminal of the transistor; and
   storing the modified terminal voltage in a memory device for computing dynamic behavior of the transistor at the current state.

3. The computer-implemented method of claim 2, wherein representing static behavior of a transistor comprises:
   representing a channel equilibrium charge of the transistor with respect to variations of voltages between a drain terminal and a source terminal, between a gate terminal and the source terminal, and between a body terminal and the source terminal.

4. The computer-implemented method of claim 3, wherein representing static behavior of a transistor further comprises:
   representing a charge of the transistor at the drain terminal with respect to variations of voltages between the drain terminal and the source terminal, between the gate terminal and the source terminal, and between the body terminal and the source terminal.

5. The computer-implemented method of claim 2, wherein representing static behavior of a transistor comprises:
   representing a charge of the transistor at the drain terminal with respect to variations of voltages between a drain terminal and a source terminal, between a gate terminal and the source terminal, and between a body terminal and the source terminal;
   representing a charge of the transistor at the gate terminal with respect to variations of voltages between the drain terminal and the source terminal, between the gate terminal and the source terminal, and between the body terminal and the source terminal; and
   representing a charge of the transistor at the source terminal with respect to variations of voltages between the drain terminal and the source terminal, between the .gate terminal and the source terminal, and between the body terminal and the source terminal.

6. The computer-implemented method of claim 2, wherein computing a previous state of the instance comprises:
   computing a last converged simulation time of the instance;
   computing a channel equilibrium charge of the instance at the last converged simulation time;
   computing a deficit or surplus charge of the instance at the last converged simulation time;
   computing a gate terminal charge of the instance at the last converged simulation time;
   computing a body terminal charge of the instance at the last converged simulation time;
   computing a drain terminal charge of the instance at the last converged simulation time; and
   computing a source terminal charge of the instance at the last converged simulation time.

7. The computer-implemented method of claim 2, wherein the non-quasi static model comprises at least one of:
   a resistor-capacitor (RC) network for retaining state information of the transistor; and
   a resistor-inductor-capacitor (RLCK) network for retaining state information of the transistor.

8. The computer-implemented method of claim 2, wherein computing a variation in channel charge of the instance comprises:
   computing a difference between the channel charge of the instance at equilibrium and the channel charge at a current time, wherein the difference is a deficit or surplus channel charge of the instance at the current time.

9. The computer-implemented method of claim 2, wherein computing a current state of the instance comprises:
   computing a current converged simulation time of the instance;
   computing a channel equilibrium charge of the instance at the current converged simulation time;
   computing a deficit or surplus charge of the instance at the current converged simulation time;

computing a gate terminal charge of the instance at the current converged simulation time;

computing a body terminal charge of the instance at the current converged simulation time;

computing a drain terminal charge of the instance at the current converged simulation time; and computing a source terminal charge of the instance at the current converged simulation time.

10. The computer-implemented method of claim 2, wherein computing a modified terminal voltage at a terminal comprises at least one of:

computing a first dynamic voltage across a first parasitic resistance at a gate terminal of the transistor;

computing a second dynamic voltage across a second parasitic resistance at a body terminal of the transistor;

computing a third dynamic voltage across a third parasitic resistance at a drain terminal of the transistor; and computing a fourth dynamic voltage across a fourth parasitic resistance at a source terminal of the transistor.

11. The computer-implemented method of claim 2, wherein the modified terminal voltage comprises a static voltage caused by a direct current that flows through the terminal of the transistor.

12. A system for simulating dynamic behavior of a transistor, comprising:

at least one processing unit for executing computer programs;

a graphical-user-interface for viewing representations of the integrated circuit on a display;

a memory for storing information of the integrated circuit;

logic for representing static behavior of a transistor using a lookup table, wherein the lookup table describes a plurality of instances of the transistor according to a plurality of predefined parameters;

logic for selecting an instance of the transistor from the lookup table for computing dynamic behavior of the transistor;

logic for computing a previous state of the instance using a non-quasi static analytical model;

logic for computing a variation in channel charge of the instance according to a rate of change in time;

logic for computing a current state of the instance using the previous state and the variation in channel charge;

logic for computing a modified terminal voltage at a terminal according to the current state and with respect to change in time, wherein the modified terminal voltage comprises a dynamic voltage across a parasitic resistance at the terminal of the transistor; and logic for storing the modified terminal voltage in a memory device for computing dynamic behavior of the transistor at the current state.

13. The system of claim 12, wherein the logic for representing static behavior of a transistor comprises at least one of:

logic for representing a channel equilibrium charge of the transistor with respect to variations of voltages between a.drain terminal and a source terminal, between a gate terminal and the source terminal, and between a body terminal and the source terminal; and logic for representing a charge of the transistor at the drain terminal with respect to variations of voltages between the drain terminal and the source terminal, between the gate terminal and the source terminal, and between the body terminal and the source terminal.

14. The system of claim 12, wherein the logic for computing a previous state of the instance comprises:

logic for computing a last converged simulation time of the instance;

logic for computing a channel equilibrium charge of the instance at the last converged simulation time;

logic for computing a deficit or surplus charge of the instance at the last converged simulation time;

logic for computing a gate terminal charge of the instance at the last converged simulation time;

logic for computing a body terminal charge of the instance at the last converged simulation time;

logic for computing a drain terminal charge of the instance at the last converged simulation time; and logic for computing a source terminal charge of the instance at the last converged simulation time.

15. The system of claim 12, wherein the non-quasi static model comprises at least one of:

a resistor-capacitor (RC) network for retaining state information of the transistor; and a resistor-inductor-capacitor (RLC K) network for retaining state information of the transistor.

16. The system of claim 12, wherein the logic for computing a variation in channel charge of the instance comprises:

logic for computing a difference between the channel charge of the instance at equilibrium and the channel charge at a current time, wherein the difference is a deficit.or surplus channel charge of the instance at the current time.

17. The system of claim 12, wherein the logic for computing a current state of the instance comprises:

logic for computing a current converged simulation time of the instance;

logic for computing a channel equilibrium charge of the instance at the current converged simulation time;

logic for computing a deficit or surplus charge of the instance at the current converged simulation time;

logic for computing a gate terminal charge of the instance at the current converged simulation time;

logic for computing a body terminal charge of the instance at the current converged simulation time;

logic for computing a drain terminal charge of the instance at the current converged simulation time; and logic for computing a source terminal charge of the instance at the current converged simulation time.

18. The system of claim 12, wherein the logic for computing a modified terminal voltage at a terminal comprises at least one of:

logic for computing a first dynamic voltage across a first parasitic resistance at a gate terminal of the transistor;

logic for computing a second dynamic voltage across a second parasitic resistance at a body terminal of the transistor;

logic for computing a third dynamic voltage across a third parasitic resistance at a drain terminal of the transistor; and logic for computing a fourth dynamic voltage across a fourth parasitic resistance at a source terminal of the transistor.

19. The system of claim 12, wherein the modified terminal voltage comprises a static voltage caused by a direct current that flows through the terminal of the transistor.

20. A computer program product for simulating dynamic behavior of a transistor, comprising a medium storing computer program code for execution by one or more computer systems, the computer program product comprising:

code for representing static behavior of a transistor using a lookup table, wherein the lookup table describes a plurality of instances of the transistor according to a plurality of predefined parameters, including
a channel equilibrium charge of the transistor with respect to variations of voltages between a drain terminal and a source terminal, between a gate terminal and the source terminal, and between a body terminal and the source terminal, and
a charge of the transistor at the drain terminal with respect to variations of voltages between the drain terminal and the source terminal, between the gate terminal and the source terminal, and between the body terminal and the source terminal;
code for selecting an instance of the transistor from the lookup table for computing dynamic behavior of the transistor;
code for computing a previous state of the instance using a non-quasi static analytical model;
code for computing a variation in channel charge of the instance according to a rate of change in time;
code for computing a current state of the instance using the previous state and the variation in channel charge:
code for computing a modified terminal voltage at a terminal according to the current state and previous state of the instance, wherein the modified terminal voltage comprises a dynamic voltage across a parasitic resistance at the terminal of the transistor: and
code for storing the modified terminal voltage in a memory device for computing dynamic behavior of the transistor at the current state.

* * * * *